United States Patent
Yamaoka et al.

(10) Patent No.: US 9,443,184 B2
(45) Date of Patent: Sep. 13, 2016

(54) METHOD FOR MANUFACTURING SEALING KEY, SEALING KEY, AND SEALING DEVICE

(71) Applicant: Toppan Printing Co., Ltd., Taito-ku, Tokyo (JP)

(72) Inventors: Keinosuke Yamaoka, Tokyo (JP); Takamitsu Nakabayashi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/858,672

(22) Filed: Sep. 18, 2015

(65) Prior Publication Data

US 2016/0012328 A1  Jan. 14, 2016

Related U.S. Application Data

(63) Continuation of application No. PCT/JP2014/057374, filed on Mar. 18, 2014.

(30) Foreign Application Priority Data

Mar. 21, 2013 (JP) ................................. 2013-058276

(51) Int. Cl.

| G06K 19/06 | (2006.01) |
| G06K 19/077 | (2006.01) |
| G06K 19/04 | (2006.01) |
| H01L 21/52 | (2006.01) |
| H01L 21/56 | (2006.01) |
| H01L 23/053 | (2006.01) |
| H01L 23/31 | (2006.01) |

(52) U.S. Cl.
CPC ........ G06K 19/07745 (2013.01); G06K 19/048 (2013.01); G06K 19/07724 (2013.01); G06K 19/07749 (2013.01); H01L 21/52 (2013.01); H01L 21/565 (2013.01); H01L 23/053 (2013.01); H01L 23/3107 (2013.01); H01L 2924/0002 (2013.01)

(58) Field of Classification Search
CPC ........ G06K 19/06; G06K 19/00; G06K 7/08; G06K 5/00; G06F 17/06
USPC ......................... 235/492, 380, 441, 375, 487
See application file for complete search history.

(56) References Cited

FOREIGN PATENT DOCUMENTS

| CN | 201860937 U | 6/2011 |
| JP | 2005-293520 A | 10/2005 |
| JP | 2012-198589 A | 10/2012 |

OTHER PUBLICATIONS

International Search Report dated Jun. 3, 2014 issued in PCT/JP2014/057374.

*Primary Examiner* — Edwyn Labaze
(74) *Attorney, Agent, or Firm* — Foley & Lardner LLP

(57) ABSTRACT

A sealing key includes a container and an IC tag component fixed inside the container. The container has a shape that includes a body part and an insertion part that protrudes from the body part. The IC tag component includes a base, an IC chip mounted on the base, and a circuit pattern formed on the base. The circuit pattern includes an antenna structure that is connected to the IC chip to enable the IC chip to perform non-contact communication in. A method for manufacturing the sealing key includes: arranging in a mold a support part that configures a portion of the container; arranging the IC tag component on the support part such that the circuit pattern is positioned being extended across a boundary between the insertion part and the body part; and pouring a resin into the mold to thereby form a resin seal part that configures a portion of the container and seals the IC tag component, such that the resin seal part is joined with the support part.

11 Claims, 6 Drawing Sheets

METHOD FOR MANUFACTURING SEALING KEY, SEALING KEY, AND SEALING DEVICE

CROSS-REFERENCE TO RELATED PATENT APPLICATIONS

This application is an application filed under 35 U.S.C. 111(a) claiming the benefit under 35 U.S.C. §§120 and 365(c) of PCT International Application No. PCT/JP2014/057374 filed on Mar. 18, 2014, which is based upon and claims the benefit of priority of Japanese Application No. 2013-058276, filed on Mar. 21, 2013, the entire contents of them all are hereby incorporated by reference.

TECHNICAL FIELD

The technique of the present disclosure relates to a sealing key used for sealing a target to be sealed, a sealing device, and a method for manufacturing the sealing key.

BACKGROUND ART

A sealing device includes a fixture that encloses a target to be sealed, and a sealing key that locks the fixture. To unseal the sealing device, the sealing key has to be destroyed. Therefore, it is possible to distinguish whether or not fraudulent substitution or fraudulent unsealing of the target has been conducted by a third party.

For example, PTL 1 discloses a sealing tool that includes a body that rotatably supports a U-shaped arm for sealing a target to be sealed, and a lock key that releases locking by being destroyed. PTL 2 discloses a sealing device that includes a fixture provided to fix a slider of a fastener, and a sealing key that releases locking by being destroyed.

The sealing device as mentioned above requires a means for sensing destruction of the sealing key by a method other than visual inspection. As a sealing device that includes such a detecting means, PTL 3, for example, discloses a technique in which the sealing key described in PTL 2 is further incorporated with an IC tag. A signal originating from the IC tag is detected by a detector through non-contact communication. When the sealing device is unsealed, the sealing key is destroyed and at the same time an antenna of the IC tag is also destroyed, and thereby unsealing of the sealing device is detected.

CITATION LIST

Patent Literature

PTL 1: JP-B-4106142
PTL 2: CN-UM-B-200997959
PTL 3: CN-UM-B-201860937

SUMMARY OF THE INVENTION

Technical Problem

In the sealing key of PTL 3, however, there is perhaps a low certainty with which the antenna of the IC tag is destroyed together with the destruction of the sealing key. Therefore, there is only a low reliability in detecting the destruction of the sealing key based on a change in the signal originating from the IC tag.

The technique of the present disclosure provides a method for manufacturing a sealing key that can enhance reliability of detecting unsealing of a sealing device by using an IC tag, and also provides the sealing key, and the sealing device.

In an aspect of a method for manufacturing a sealing key according to the present disclosure, the sealing key includes a container and an IC tag component fixed inside the container, the container having a shape that includes a body part and an insertion part that protrudes from the body part, the IC tag component having a base, an IC chip mounted on the base, and a circuit pattern formed on the base, the circuit pattern including an antenna structure that is connected to the IC chip to enable the IC chip to perform non-contact communication. The manufacturing method includes: arranging in a mold a support part that configures a portion of the container; arranging the IC tag component on the support part such that the circuit pattern is positioned being extended across a boundary between the insertion part and the body part; and pouring a resin into the mold to thereby form a resin seal part that configures a portion of the container and seals the IC tag component, such that the resin seal part is joined with the support part.

An aspect of the sealing key according to the present disclosure includes: an IC tag component that has a base, an IC chip mounted on the base, and a circuit pattern formed on the base, the circuit pattern including an antenna structure that is connected to the IC chip to enable the IC chip to perform non-contact communication; and a container that has a support part that supports the IC tag component and a resin seal part that is joined with the support part so as to cover and seal the IC tag component, the container having a shape that includes a body part and an insertion part that protrudes from the body part, wherein: the IC tag component is fixed inside the container such that the circuit pattern is positioned being extended across a boundary between the insertion part and the body part.

An aspect of the sealing device according to the present disclosure includes: the sealing key according to the present disclosure; and a sealing device body that includes a sealing key fixing mechanism that allows the sealing key to be fixed in the body when the insertion part is inserted into the body.

DESCRIPTION OF EMBODIMENTS

There will be described an embodiment of a method for manufacturing a sealing key, the sealing key, and a sealing device.

Figure 1:
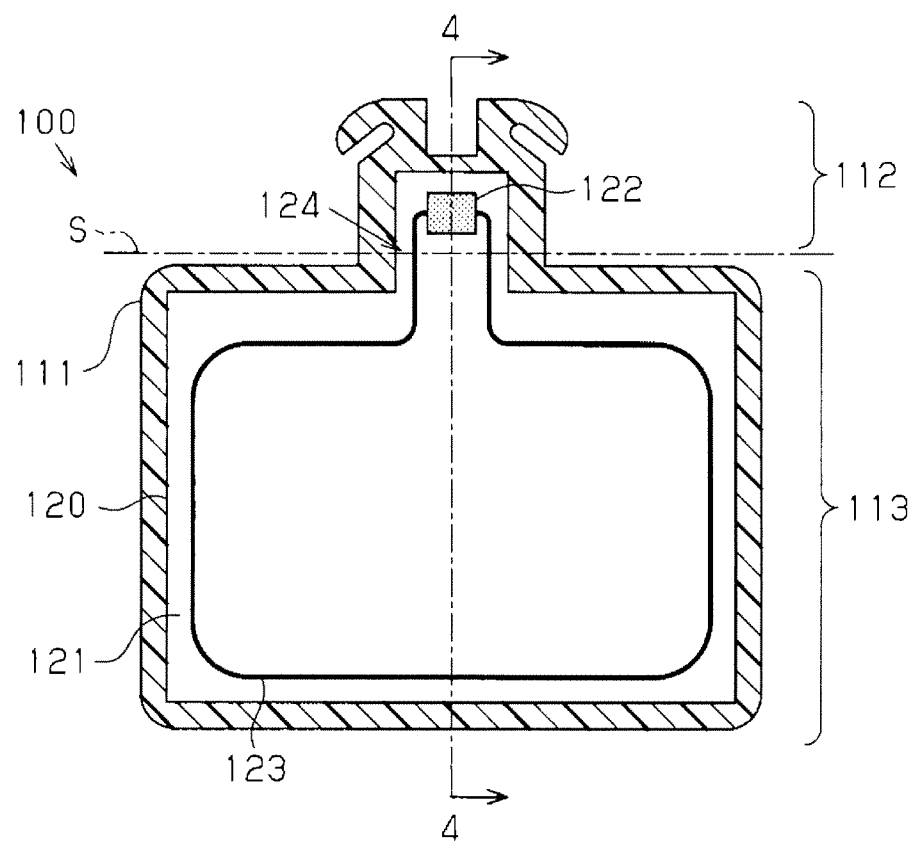
FIG. 1 is a cross section that shows an internal configuration of a sealing key according to an embodiment of the technique of the present disclosure.

As shown in FIG. 1, a sealing key 100 includes a container 111 that includes an insertion part 112 and a body part 113, and an IC tag component 120. The insertion part 112 is inserted into a sealing device body, that is an object to which the sealing key 100 is applied, and fixed to the sealing device body.

The IC tag component 120 includes a circuit pattern 123 formed on a base 121, and an IC chip 122 mounted on the base 121 to establish a connection to the circuit pattern 123. The IC tag component 120 is accommodated and fixed inside the container 111. Inside the container 111, the circuit pattern 123 includes a loop antenna that extends across a boundary S between the insertion part 112 and the body part 113. The circuit pattern 123 includes an antenna structure that enables communication between a reader/writer device and the IC chip through non-contact communication.

The base 121 includes a portion that extends across the boundary S between the insertion part 112 and the body part 113. This portion may be formed with a relatively or more easy-to-split processed part 124, which is an example of the easy-to-split part that facilitates splitting of the base 121 along the boundary S.

Figure 2:
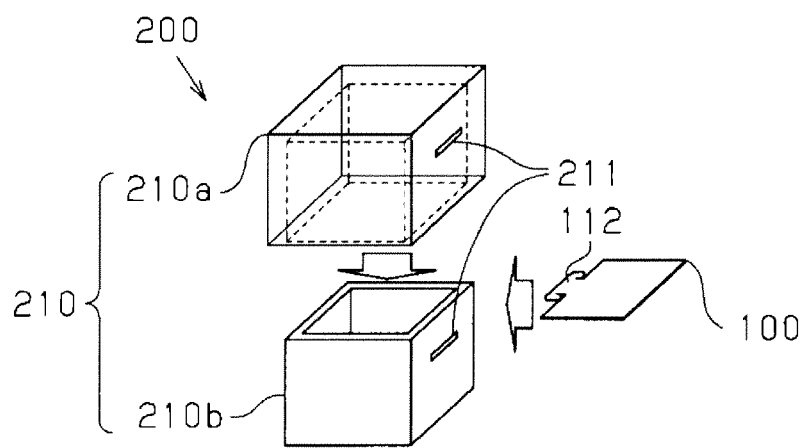
FIG. 2 is a perspective view that shows a configuration of a sealing device that includes the sealing key shown in FIG. 1, and shows a state of the sealing device before a target is sealed.

As shown in FIG. 2, a sealing device body 210 has a sealing key fixing mechanism 211 of fixing the insertion part 112 of the sealing key 100 to the sealing device body 210. The insertion part 112 is inserted into the sealing key fixing mechanism 211. The configuration other than the configuration of the sealing key fixing mechanism 211, such as the shape or size of the sealing device body 210, is not particularly limited, and thus is appropriately designed in accordance with the usage of the sealing device 200.

In an example shown in FIG. 2, for example, the sealing device body 210 includes a lid-part box 211a and a bottom-part box 211b. Each of the lid-part box 211a and the bottom-part box 211b is provided with an insertion opening. The insertion opening functions as a part of the sealing key fixing mechanism 211. The lid-part box 211a and the bottom-part box 211b are assembled and the sealing key 100 is inserted into the insertion opening of the lid-part box 211a and the insertion opening of the bottom-part box 211b, and the sealing key 100 is thereby fixed to the sealing device body 210.

Figure 3:
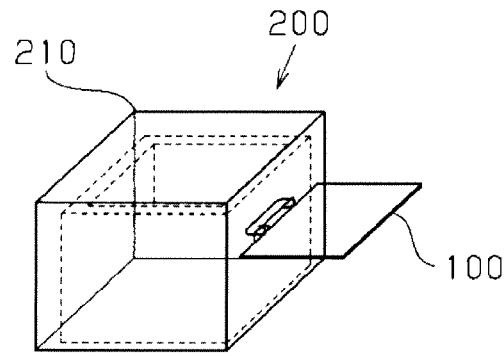
FIG. 3 is a perspective view that shows a configuration of the sealing device shown in FIG. 2, and shows a state of the sealing device after the target has been sealed.

As shown in FIG. 3, the insertion part 112 is fixedly fitted to the insertion openings in a state where the lid-part box 211a and the bottom-part box 211b are assembled and the sealing key 100 is inserted into the insertion opening of the lid-part box 211a and the insertion opening of the bottom-part box 211b. This makes it impossible to unseal the sealing device 200 by disassembling the lid-part box 211a and the bottom-part box 211b. The sealing device 200 may be attached to a portion of a case, a bag, a chain, or the like, or the sealing device body 210 may be a case or a bag.

When the sealing device 200 is unsealed, the sealing key 100 is broken along the boundary S, and the insertion part 112 and the body part 113 are split. Since the circuit pattern 123 extends across the boundary S between the insertion part 112 and the body part 113 of the sealing key 100, the breaking of the IC tag component 120 at the boundary S also splits the circuit pattern 123. The splitting of the circuit pattern 123 that has an antenna function causes loss or change of the signal originating from the IC tag component 120. In other words, when the sealing key 100 is broken, the certainty of causing loss or change of signal is increased, resulting in increasing the reliability of detecting unsealing of the sealing device 200 on the basis of such loss or change of signal.

An example of a detailed configuration of the sealing key 100 will be described below.

[Cross Sectional Structure of Sealing Key 100]

Figure 4:
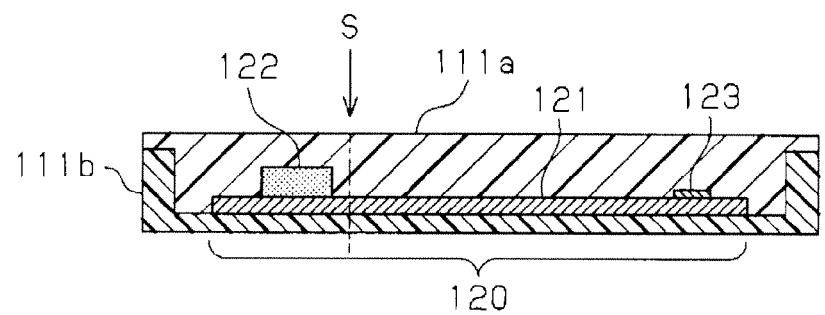
FIG. 4 is a cross section taken along the line 4-4 of FIG. 1.
Figure 5:
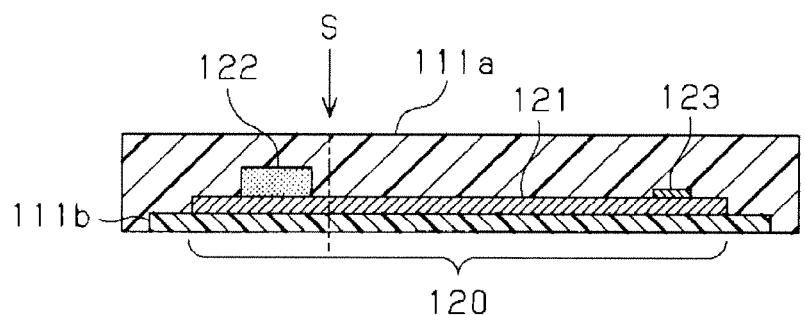
FIG. 5 is a cross section that shows another example of the cross sectional structure of the sealing key according to the representative embodiment, and shows a cross sectional structure corresponding to FIG. 4.

FIG. 4 is a cross section taken along the line 4-4 of FIG. 1 illustrating the sealing key 100. FIG. 5 is a cross section that shows another example of the cross sectional structure of the sealing key 100 and corresponds to FIG. 4.

In the container 111, the insertion part 112 protrudes from a portion of an outer edge of the body part 113. The insertion part 112 includes a fixing mechanism with a hook-shape structure, for example, functioning such that when the insertion part 112 is once inserted into the sealing device body 210, it cannot be pulled out of the sealing device body 210. By disabling the insertion part 112 from being pulled out of the sealing device body 210, the target to be sealed is enclosed.

As shown in FIG. 4, the container 111 includes an upper resin seal part 111a and a lower container 111b. The IC tag component 120 is accommodated inside the container 111. As a material for forming the container 111, a resin material such as a polystyrene resin or an ABS resin is preferably used.

The lower container 111b has a box shape so as to be able to accommodate the IC tag component 120 therein.

The IC tag component 120 includes the base 121 on which the IC chip 122 is mounted and on which the circuit pattern 123 is formed. The circuit pattern 123 at least includes an antenna structure for enabling non-contact communication between an external reader/writer device and the IC chip. In the circuit pattern 123, at least a portion that extends across the boundary S between the insertion part 112 and the body part 113 is preferably a printed material or an etching-processed material. In the case where the portion that extends across the boundary S in the circuit pattern 123 is ensured to be made of a printed material or an etching-processed material, when the sealing key 100 is broken and at the same time the base 121 is also broken, the circuit pattern 123 is split in this portion that extends across the boundary S between the insertion part 112 and the body part 113.

The circuit pattern 123 is formed as a printed material in which an electrically-conductive ink is printed on the base 121. Various printing methods, such as offset printing, screen printing, and flexographic printing, are used for forming the circuit pattern 123. The electrically-conductive ink is generally composed of but not limited to metal microparticles dispersed in a solvent, such as a silver paste or a copper paste.

Alternatively, the circuit pattern 123 is formed as an etching-processed material of a metal foil such as of copper or aluminum which is stacked on the base 121. In forming the circuit pattern 123, a dry-etching method, a wet-etching method, or the like is used. If the metal foil has a large thickness, it will be difficult to break the circuit pattern 123, and hence the thickness of the metal foil is preferably not less than 5 μm but not more than 36 μm.

The material of the base 121 includes, for example, but is not limited to, a resin film of polyester, such as polyethylene terephthalate (PET), polyethylene naphthalate or polybutylene terephthalate, or of polyethylene, polypropylene, or the like, or a commonly-used paper sheet made of pulp.

If the easy-to-split processed part 124 is formed in the base 121, the base 121 that includes the easy-to-split processed part 124 preferably has a small tear strength to such an extent that, when the sealing key 100 is bent and the container 111 is broken, the easy-to-split processed part 124 is torn simultaneously with the breaking of the container 111. Note that an excessively small tear strength may cause breaking of the base 121 when the sealing key 100 is manufactured or before the sealing of the sealing key 100 is unsealed. For this reason, the base 121 preferably has a tear strength that falls within a predetermined range. For example, in the case where the base 121 has a width of 15 mm, the tear strength along a direction of a plane orthogonal to the boundary S is preferably not less than 10 N/15 mm but not more than 80 N/15 mm. Such a range of the tear strength can be obtained by using a test piece of the base 121 that has a width of 15 mm. For example, to obtain the range, both ends of the test piece in the direction orthogonal to the width direction of the test piece are fixed to a tear strength test device, and a tension necessary for tearing the test piece is detected.

The base 121 may be subjected to surface treatment to enhance adhesion between the base 121 and the circuit pattern 123. For example, in order to improve adhesion between the base 121 and the circuit pattern 123, a corona discharge treatment may be conducted of a surface of the base 121, or an anchor coat (primer layer) may be added to the surface.

Note that, as shown in FIG. 5, the container 111 only needs to have a shape that supports the IC tag component 120, and thus may have a dish shape, for example, with a size slightly larger than that of the IC tag component 120. In addition, in order to easily accelerate breaking along the boundary S between the insertion part 112 and the body part 113 in the container 111, a portion that extends, in the container 111, across the boundary S between the insertion part 112 and the body part 113 may include an easy breakage means, which is a structure that includes a groove, a perforation, or the like.

In the circuit pattern 123, a portion that extends across the boundary S between the insertion part 112 and the body part 113 may be configured with a tamper line. The tamper line is a loop circuit which, for example, sets predetermined data stored in the IC chip 122 to an ON state by the tamper line's being in a connecting state, and on the other hand, sets the predetermined data to an OFF state by the tamper line's being in a non-connecting state. In this case, a circuit pattern that includes the antenna structure and a circuit pattern that includes the tamper line are each connected to the IC chip 122. In such a configuration, when the breaking of the sealing key 100 causes the circuit pattern 123 to split between the insertion part 112 and the body part 113, the signal transmitted from the IC chip 122 changes, and hence the unsealing of the sealing device 200 can be sensed.

[Shape of Circuit Pattern 123]

The circuit pattern 123 only needs to have an appropriately suitable shape in accordance with a desired communication wavelength or the shape of the sealing key 100, within a scope not departing from the object of the invention. With reference to FIGS. 6 to 14, examples of the shape of the circuit pattern 123 will be described. FIGS. 6 to 10 each show an example of the circuit pattern 123 that configures an antenna for UHF bands.

Figure 6:
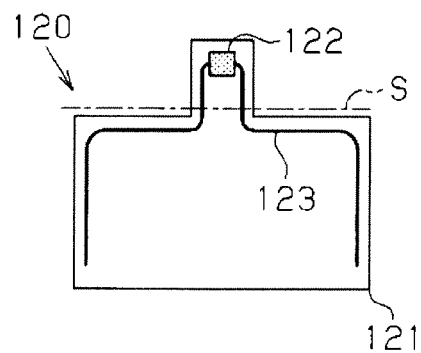
FIG. 6 is a diagram that shows a modification of the configuration of the circuit pattern in the sealing key according to the embodiment.

As shown in FIG. 6, the circuit pattern 123 may include a dipole antenna as an antenna structure. When the circuit pattern 123 includes a dipole antenna, the antenna structure in the circuit pattern 123 is preferably bilaterally symmetric relative to the IC chip 122.

Figure 7:
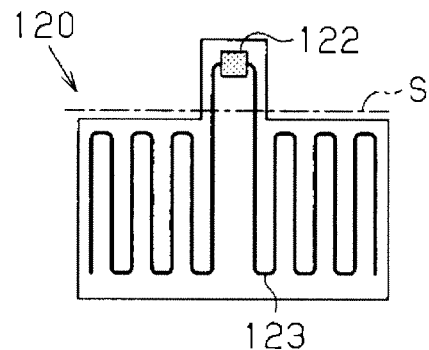
FIG. 7 is a diagram that shows a modification of the configuration of the circuit pattern in the sealing key according to the embodiment.

As shown in FIG. 7, the circuit pattern 123 may include an antenna structure that has a wavy shape. If the antenna structure in the circuit pattern 123 is configured to have a wavy shape, the circuit pattern 123 will have a larger substantial antenna length when compared with the case where the antenna structure is configured to have a linear shape. Note that, for another shape that has a larger substantial antenna length, the circuit pattern 123 may include an antenna structure that has a spiral shape.

Figure 8:
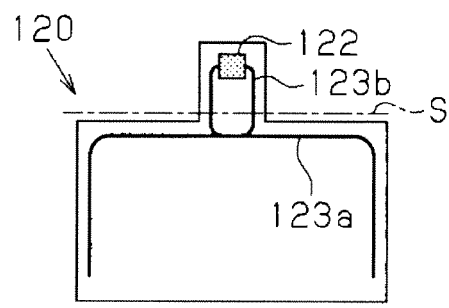
FIG. 8 is a diagram that shows a modification of the configuration of the circuit pattern in the sealing key according to the embodiment.
Figure 9:
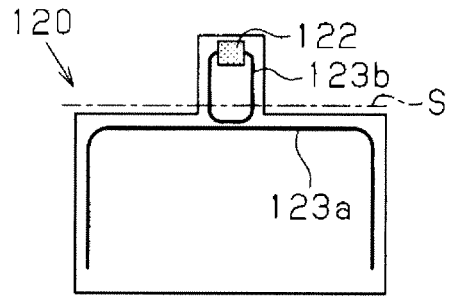
FIG. 9 is a diagram that shows a modification of the configuration of the circuit pattern in the sealing key according to the embodiment.

As shown in FIG. 8, the circuit pattern 123 may include a radiation element part 123a that functions as a radiation element, and a matching circuit 123b that adjusts impedance. In this case, as shown in FIG. 9, the matching circuit 123b and the radiation element part 123a may be spaced apart from each other, and hence the circuit pattern 123 is configured with the radiation element part 123a, the matching circuit 123b, and a gap between the radiation element part 123a and the matching circuit 123b.

Figure 10:
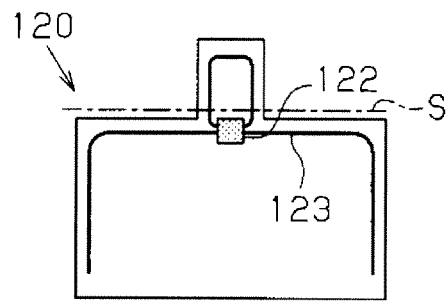
FIG. 10 is a diagram that shows a modification of the configuration of the circuit pattern in the sealing key according to the embodiment.

In the example shown in FIG. 10, the IC chip 122 is arranged not in the insertion part 112 but in the body part 113. In the example shown in FIG. 10, the portion that extends across the boundary S between the insertion part 112 and the body part 113 in the circuit pattern 123 configures a tamper line.

Figure 11:
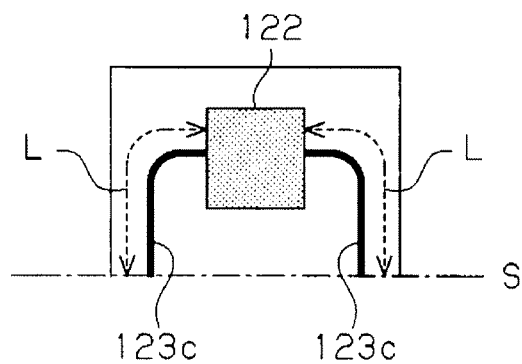
FIG. 11 is a diagram that shows a configuration of circuit pattern segments, each of which is a portion of a split circuit pattern, in the sealing key according to the embodiment.

Note that, in the example shown in each of FIG. 1 and FIGS. 6 to 10, the circuit pattern 123 is split on the boundary S as shown in FIG. 11. At this time, the IC chip 122 and the circuit pattern 123 are preferably arranged on the base 121 such that a circuit pattern length L, which is a length of each circuit pattern segment 123c connected to the IC chip 122, will be equal to or less than $\lambda/20$, where $\lambda$ is a communication wavelength. If two circuit pattern segments 123c connected to the IC chip 122 have mutually different lengths, the shorter of the circuit pattern segments 123 may only need to have the circuit pattern length L equal to or less than λ/20. In other words, regardless of whether the IC chip 122 is arranged in the insertion part 112 or in the body part 113, the IC chip 122 and the circuit pattern 123 are preferably arranged such that one of the lengths of the circuit pattern 123 as defined below, whichever is shorter, becomes equal to or less than λ/20. Specifically, each of the lengths of the circuit pattern 123 is defined to range from the intersection where the circuit pattern 123 meets the boundary S between the insertion part 112 and the body part 113, to a connecting point of the circuit pattern 123 and the IC chip 122.

For example, if a 900 MHz UHF band is used, the circuit pattern length L of the circuit pattern segment 123c obtained after the circuit pattern 123 is split up is approximately 17 mm. If the circuit pattern length L of the circuit pattern segment 123c is equal to or less than λ/20, the antenna length is sufficiently short relative to the communication wavelength, and hence the circuit pattern segment 123c that has been split along the boundary S is inhibited from functioning as a dipole antenna, resulting in communication being inhibited.

Figure 12:
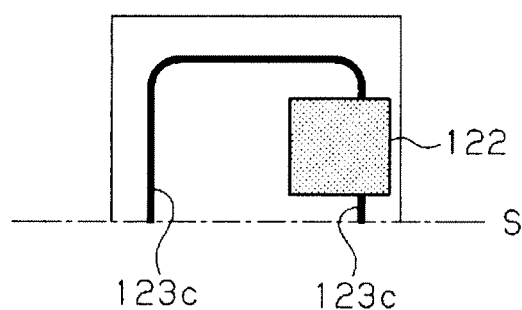
FIG. 12 is a diagram that shows a modification of the configuration of the circuit pattern segments in the sealing key according to the embodiment.

As shown in FIG. 12, the position of the IC chip 122 may be positioned in the two circuit pattern segments 123c in an unbalanced manner, and one of the two circuit pattern segments 123c connected to the IC chip 122 may have a length of approximately 0.

Figure 13:
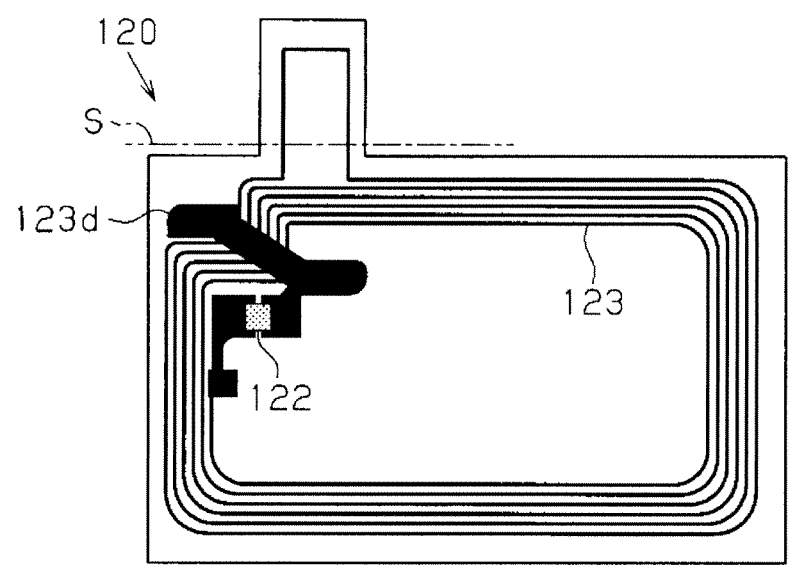
FIG. 13 is a diagram that shows a modification of the configuration of the circuit pattern that includes an antenna structure for HF bands in the sealing key according to the embodiment.
Figure 14:
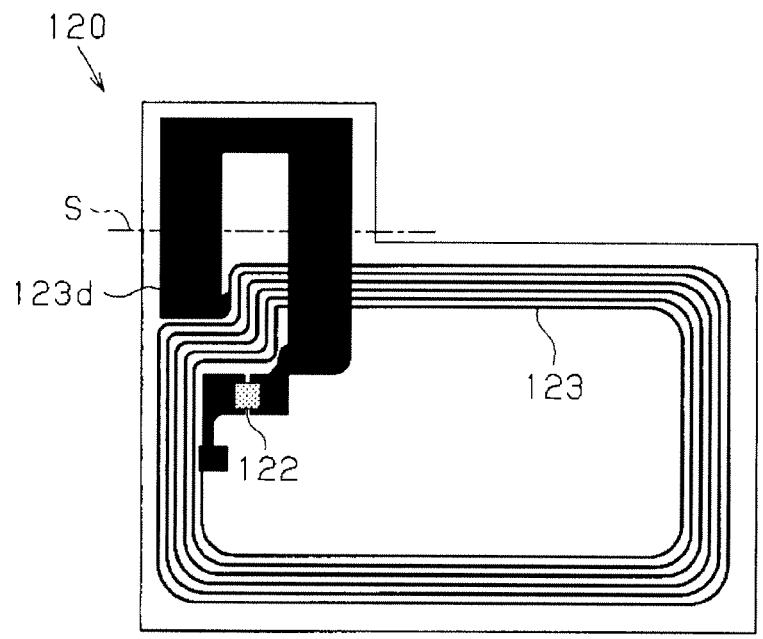
FIG. 14 is a diagram that shows a modification of the configuration of the circuit pattern that includes the antenna structure for HF bands in the sealing key according to the embodiment.

FIGS. 13 and 14 show examples of the circuit pattern 123 that includes an antenna structure in which a multi-turn antenna coil is used. If LF bands or HF bands are utilized, a multi-turn antenna coil is needed. In this case, the circuit pattern 123 includes a jumper wire 123d bridging across the circuit.

In the example shown in FIG. 13, the circuit pattern 123 includes a multi-turn antenna coil as the antenna structure, with a portion of the multi-turn antenna coil protruding from the body part 113 into the insertion part 112. When the sealing key 100 is broken along the boundary S, a portion of the circuit pattern 123 that protrudes into the insertion part 112 is split from a portion of the circuit pattern 123 that is positioned in the body part 113.

In the example shown in FIG. 14, the circuit pattern 123 includes a jumper wire 123d that connects a multi-turn antenna coil and the IC chip 122, both positioned in the body part 113. A portion of the jumper wire 123d protrudes from the body part 113, in which the IC chip 122 is positioned, into the insertion part 112. When the sealing key 100 is broken along the boundary S, the portion of the jumper wire 123d that protrudes into the insertion part 112 is split from a portion of the jumper wire 123d that is positioned in the body part 113. According to this configuration, it is possible to arrange the circuit pattern 123 such that the circuit pattern 123 is split along the boundary S, by changing the arrangement of the jumper wire 123d, with the pattern of the antenna coil unchanged.

In the process of forming such a circuit pattern 123, the multi-turn antenna coil is formed, and then an insulating layer of a resist resin or the like is formed in a region where the jumper wire 123d is to be formed, so as to cover the multi-turn antenna coil. The jumper wire 123d is then printed on the insulating layer. Note that, if a portion of the circuit pattern 123 arranged in the insertion part 112 is formed by printing, splitting of the circuit pattern 123 is facilitated. Therefore, in the example shown in FIG. 13, only the multi-turn antenna coil in the circuit pattern 123 may be formed by printing, while in the example shown in FIG. 14, only the jumper wire 123d in the circuit pattern 123 may be formed by printing.

[Easy-to-Split Processed Part 124]

The relatively or more easy-to-split processed part 124 may have dashed line-like holes, i.e. a perforation, for cutting off the base 121 along the boundary S. The size of each perforation hole is preferably equal to or less than a half of the line width of the circuit pattern 123. If the size of each perforation hole is equal to or less than a half of the line width of the circuit pattern 123, the circuit pattern 123 will not be broken when a hole of the perforation overlaps the circuit pattern 123.

Alternatively, the processed part 124 may have a slit, which is a hole formed amid the circuit pattern 123. The number of the slits provided may be two or more and these slits may be formed along the boundary S so as to be located in a region not including the circuit pattern 123.

Alternatively, the processed part 124 may have a notch formed in a site that is at an edge of the base 121 and that overlaps the boundary S.

The processed part 124 may also be structured by combining the notch with the perforation or the slit described above. In other words, the notch is formed on an edge of the base 121, the edge overlapping the boundary S, and the perforation or the slit is formed in the base 121 so as to be located in a region where the base 121 overlaps with the boundary S but other than the region where the notch is formed. This improves the ease of splitting the base 121 along the boundary S, resulting in that when the sealing key 100 is broken, the certainty of breaking the circuit pattern 123 is enhanced.

[Method of Manufacturing Sealing Key]

A representative method of manufacturing the sealing key will be described. The container 111 is formed by insert molding or casting. In the process of manufacturing the sealing key 100, a mold for forming the container 111 is prepared, for example, and the lower container 111b, which is an example of the support part, is arranged first in this mold. The IC tag component 120 is then arranged on the lower container 111b, and a resin, which is to serve as the upper resin seal part 111a, is poured inside the mold. The upper resin seal part 111a and the lower container 111b are thereby joined to form the container 111 that includes the lower container 111b and the upper resin seal part 111a. Along with the formation of the container 111, the circuit pattern 123 is positioned so as to be extended across the boundary S between the insertion part 112 and the body part 113, and the container 111 and the IC tag component 120 are integrated.

In the process of manufacturing the sealing key 100, when the IC tag component 120 is accommodated in the lower container 111b, the IC tag component 120 is preferably fixed to the lower container 111b. This allows the IC tag component 120 to be more easily broken simultaneously with the breaking of the container 111.

An example of the fixing method includes a method of fixing the IC tag component 120 to the lower container 111b by means of an adhesive. For example, an adhesive is applied to the lower container 111b to form an adhesive layer, and the IC tag component 120 is arranged on the adhesive layer to thereby fix the IC tag component 120 to the container 111. It should be noted that the peripheral region of the boundary S between the insertion part 112 and the body part 113 is preferably a non-adhesive region where no adhesive layer is formed. If there is adopted a configuration where no adhesive is coated to the peripheral region of the boundary S, the IC tag component 120 will be broken more easily at the portion that extends across the boundary S between the insertion part 112 and the body part 113.

Another example of the method of fixing the IC tag component 120 to the lower container 111b includes a method of providing one or more protrusions inside the lower container 111b and allowing the protrusions to penetrate the base 121. For example, holes facing the lower container 111b are formed in the base 121, while the lower container 111b and the protrusions are integrally molded, and the IC tag component 120 is arranged in the lower container 111b such that the protrusions of the lower container 111b penetrate the holes of the base 121. The protrusions, which act as starting points of the breaking in the base 121, can allow the base 121 to be broken more easily. The protrusions therefore are preferably arranged in the vicinity of the boundary S between the insertion part 112 and the body part 113. In this method, paper that is torn easily is preferably used as the base 121.

The above-described methods of fixing the IC tag component 120 to the container 111 may be used in combination. For example, the adhesive layer may be provided in the container 111, and the protrusions may be provided in the non-adhesive region in the vicinity of the boundary S between the insertion part 112 and the body part 113 to allow the protrusions to penetrate the base 121 made of paper.

[Examples of Configuration]

Specific examples of the configuration included in the configuration of the sealing key 100 described above will be described below.

Figure 15:
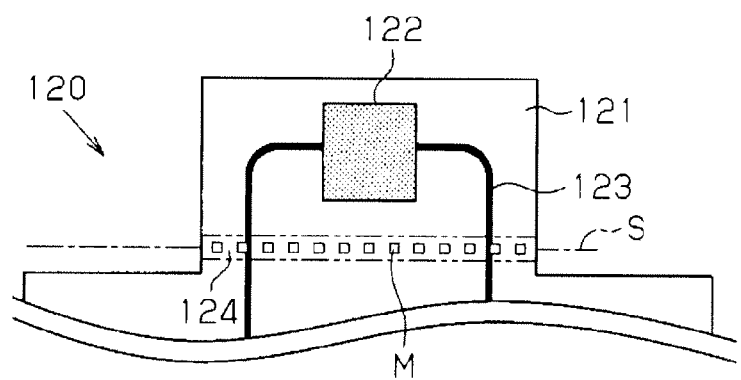
FIG. 15 is a diagram that shows an example of a configuration of a relatively or more easy-to-split processed part in the sealing key according to the embodiment.
Figure 16:
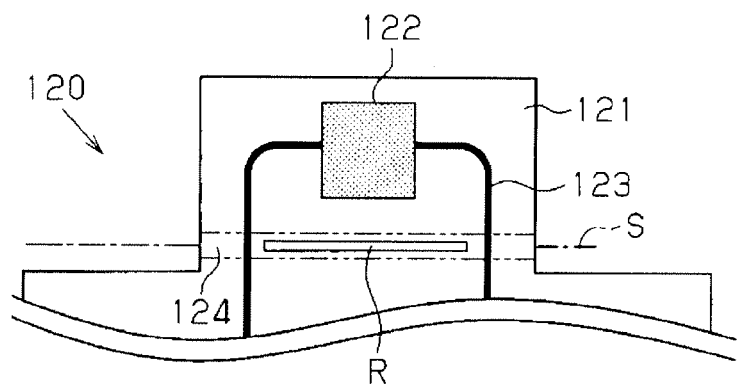
FIG. 16 is a diagram that shows an example of a configuration of a relatively or more easy-to-split processed part in the sealing key according to the embodiment.
Figure 17:
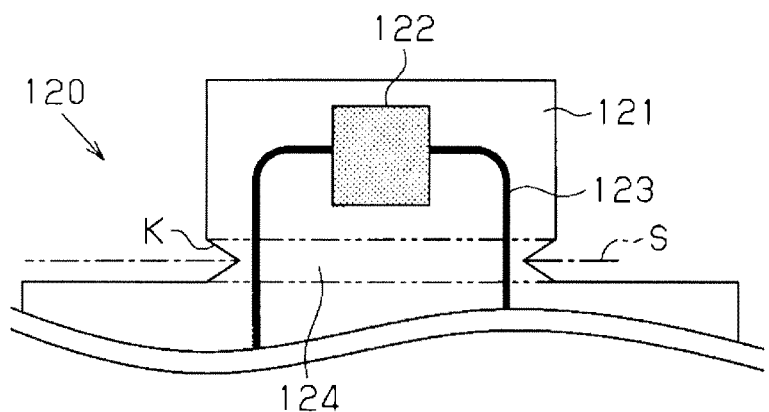
FIG. 17 is a diagram that shows an example of a configuration of a relatively or more easy-to-split processed part in the sealing key according to the embodiment.

FIGS. 15 to 17 each show an example of the structure of the easy-to-split processed part 124 included in the IC tag component 120.

In the example shown in FIG. 15, a perforation M, which corresponds to the dashed line-like through holes along the boundary S, is formed in the base 121. The linear portion where the perforation M is formed serves as the easy-to-split processed part 124.

In the example shown in FIG. 16, a slit R, which corresponds to a through hole that extends along the boundary S, is formed in the base 121. The linear portion where the slit R is formed serves as the easy-to-split processed part 124.

In the example shown in FIG. 17, notches K are formed in both end portions of the base 121, the end portions overlapping the boundary S. The linear portion connecting between the notches K serves as the easy-to-split processed part 124.

In the examples shown in FIGS. 15 to 17, the base 121 has a portion positioned in the vicinity of the boundary S to serve as the easy-to-split processed part 124 bridging over the boundary S. The area occupied by the base 121 in a direction in which the boundary S extends is minimized in the easy-to-split processed part 124. For example, in FIGS. 15 and 16, since the through hole(s) is/are formed in the easy-to-split processed part 124, the area occupied by the easy-to-split processed part 124 in the extending direction of the boundary S is smaller than that around the easy-to-split processed part 124, by an amount corresponding to the area of the through hole(s). In FIG. 16, since the notches K are formed in the easy-to-split processed part 124, the area occupied by the easy-to-split processed part 124 in the extending direction of the boundary S is smaller than that around the easy-to-split processed part 124, by an amount corresponding to the area of the notches K.

The area occupied by the easy-to-split processed part 124 in the extending direction of the boundary S may be approximately the same as that around the easy-to-split processed part 124. In this case, for example, the thickness of the easy-to-split processed part 124 is made smaller than that of a portion of the base 121 excepting the easy-to-split processed part 124. With such a configuration as well, the easy-to-split processed part 124 has a function of facilitating the splitting of the base 121.

To sum up, the easy-to-split processed part 124 is a portion which is broken more easily by an external force than the portion of the base 121 other than the easy-to-split processed part 124. Thus, the easy-to-split processed part 124 only needs to be a portion having a structure facilitating the splitting of the base 121 from between the insertion part 112 and the body part 113.

Figure 18:
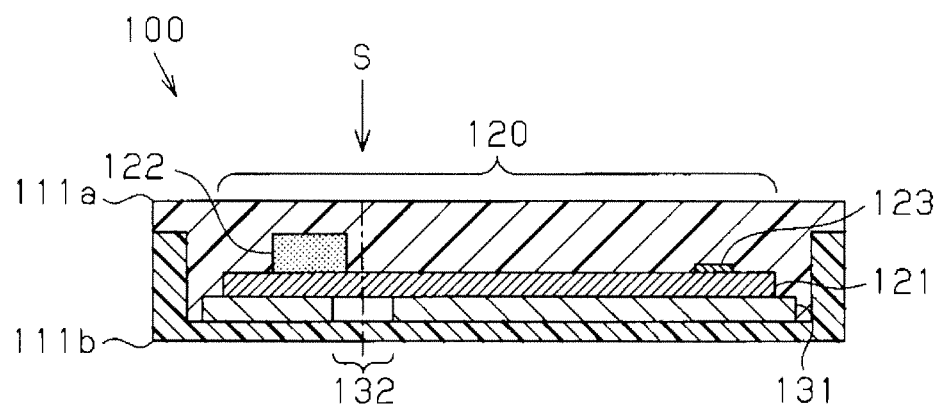
FIG. 18 is a diagram that shows an example of a structure for fixing a container and an IC tag component in the sealing key according to the embodiment.
Figure 19:
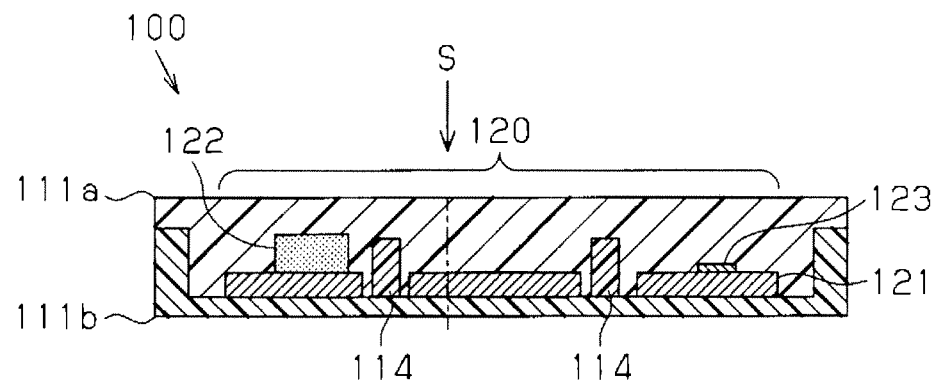
FIG. 19 is a diagram that shows an example of a structure for fixing a container and an IC tag component in the sealing key according to the embodiment.

FIGS. 18 and 19 each show an example of the structure for fixing the IC tag component 120 to the container 111.

In the example shown in FIG. 18, the lower container 111b and the IC tag component 120 are fixed via an adhesive layer 131. The adhesive layer 131 is preferably arranged at a portion excepting a peripheral region 132 of the boundary S between the insertion part 112 and the body part 113. Alternatively, in the case where a resin film is used as the base 121, the lower container 111b and the base 121 of the IC tag component 120 may be fixed by fusion by means of heating or ultrasonic waves, instead of using the adhesive layer 131. In this case as well, the peripheral region 132 of the boundary S is preferably a non-fused region where no fusion takes place.

In the example shown in FIG. 19, protrusions 114 that protrude upward are provided on a bottom surface of the lower container 111b to have the protrusions 114 penetrated the base 121 to thereby fix the IC tag component 120 to the container 111.

The shapes of the container 111 including the shapes of the insertion part 112 and the body part 113, and the structures of the lower container 111b and the upper resin seal part 111a are not limited to those in the configuration described in the above embodiment. The container 111 only needs to have a shape that includes the body part 113 and the insertion part 112 protruding from the body part 113, and include the lower container 111b and the upper resin seal part 111a that is joined with the lower container 111b to cover and seal the IC tag component 120. The boundary S between the insertion part 112 and the body part 113 is a breaking position of the sealing key 100, along which breaking takes place when the sealing device 200 is unsealed. Thus the boundary S only needs to be positioned at an end portion of the insertion part 112 that is joined with the body part 113 or at an end portion of the body part 113 that is joined with the insertion part 112.

The boundary S only needs to be arranged thereon with a portion of the circuit pattern 123 that contributes to a communication function. For example, in the case where the circuit pattern 123 includes the radiation element part 123a and the matching circuit 123b as in FIG. 9, and there is a gap between the radiation element part 123a and the matching circuit 123b, the gap which functions as a transmission path between the radiation element part 123a and the matching circuit 123b may be arranged on the boundary S.

EXAMPLES

Example 1

Coated paper with a thickness of 60 μm was used as the base 121, and the circuit pattern 123 with a thickness of approximately 5 μm was formed on the base 121 by screen printing using an electrically-conductive ink that contained a silver paste. The circuit pattern 123 was arranged such that the circuit pattern 123 configured a dipole antenna that included a matching circuit, and the IC chip 122 connected to the matching circuit was arranged in the insertion part 112 in the container 111. The lengths of the two circuit pattern segments 123c that extended from the IC chip 122 to the boundary S between the insertion part 112 and the body part 113 were each set to 14 mm.

The base 121 was then punched so as to be cut out into a shape a little smaller than that of the bottom surface of the lower container 111b. After that, an IC chip (manufactured by Impinj Inc.) was mounted to the matching circuit to thereby prepare the IC tag component 120. Note that the IC chip and the antenna were designed to enable communication using a 900 MHz UHF band.

As the lower container 111b, a container formed by injection-molding an ABS resin was used. After the lower container 111b was arranged in the mold, the IC tag component 120 was arranged on the lower container 111b, and an ABS resin was poured into the mold to form the upper resin seal part 111a and to seal the IC tag component 120. A sealing key of Example 1 was thereby obtained.

Example 2

A PET film with a thickness of 50 μm was used as the base 121, and an aluminum foil with a thickness of approximately 9 μm formed on the base 121 was etched to thereby form the circuit pattern 123. The configuration of the circuit pattern 123 was similar to that of Example 1. As in Example 1, the base 121 that had the circuit pattern 123 formed thereon was subjected to punching, and the IC chip 122 was then mounted to prepare the IC tag component 120.

The perforation M was formed in a portion of the IC tag component 120, the portion extending across the boundary S between the insertion part 112 and the body part 113 in the container 111, so as to extend along the boundary S to thereby form the easy-to-split processed part 124.

The IC tag component 120 that had the easy-to-split processed part 124 formed thereon was arranged on the lower container 111b, to form the upper resin seal part 111a in a manner as in Example 1, and a sealing key of Example 2 was thereby obtained.

Example 3

The notches K were formed in a portion of the IC tag component 120, the portion extending across the boundary S between the insertion part 112 and the body part 113 in the container 111, so as to be located at both ends of the portion in a direction along the boundary S to thereby form the easy-to-split processed part 124. Thus, excepting formation of the notches K and non-formation of the perforation M, a sealing key of Example 3 was obtained in a manner similar to Example 2.

Example 4

The slit R that extended along the boundary S between the insertion part 112 and the body part 113 was formed in a portion of the IC tag component 120, the portion extending across the boundary S in the container 111, to thereby form the easy-to-split processed part 124. Thus, excepting formation of the slit R and non-formation of the perforation M, a sealing key of Example 4 was obtained in a manner similar to Example 2.

Example 5

Excepting the use of the IC tag component 120 having no easy-to-split processed part 124, a sealing key of Example 5 was obtained in a manner similar to Example 2.

(Tear Strength Test)

To examine a tear strength of each base 121 as described in the embodiment, test pieces each having a width of 15 mm were prepared from the bases 121 used in respective Examples 1 to 5. Both ends of each of the test pieces were then fixed to the fixing part of a tear strength test device to calculate a force exerted when the test piece was torn. In this case, the test piece was ensured to extend across the boundary S between the insertion part 112 and the body part 113, and the direction in which the tension was applied to the test piece was ensured to be orthogonal to the boundary line between the insertion part 112 and the body part 113. In other words, with regard to Example 2, the perforation M was formed in the center portion of the test piece so as to be orthogonal to the direction in which the tension was applied. With regard to Example 3, the notches K were formed in the center portion of the test piece so as to be located at the ends of the test piece in the width direction. With regard to Example 4, the slit R was formed in the center portion of the test piece so as to extend in a direction orthogonal to the direction in which the tension was applied.

Table 1 shows, as the test results, a mean value of the tear strength of the samples corresponding to respective Examples 1 to 5. In the sample corresponding to Example 5, the tear strength was equal to or more than the detection limit.

TABLE 1

| Sample | Base | Easy-to-split Processed Part | Tear Strength [N/15 mm] |
|---|---|---|---|
| Example 1 | coated paper | none | 23.6 |
| Example 2 | PET film | perforation | 35.1 |
| Example 3 | PET film | notches in both ends | 70.0 |
| Example 4 | PET film | slit | 29.6 |
| Example 5 | PET film | none | 100 or more |

According to the results shown in Table 1, it was found that the base 121 was broken more easily in the case where paper was used as the base 121 than in the case where a PET film was used as the base 121. It was also found that the base 121 was broken more easily in the case where the base 121 had the easy-to-split processed part 124 than in the case where the base 121 had no easy-to-split processed part 124.

What is claimed is:

1. A method for manufacturing a sealing key, the sealing key comprising a container and an IC tag component fixed inside the container, the container having a shape that includes a body part and an insertion part that protrudes from the body part, the IC tag component having a base, an IC chip mounted on the base, and a circuit pattern formed on the base, the circuit pattern including an antenna structure that is connected to the IC chip to enable the IC chip to perform non-contact communication, the method comprising:

arranging in a mold a support part that configures a portion of the container;

arranging the IC tag component on the support part such that the circuit pattern is positioned being extended across a boundary between the insertion part and the body part; and pouring a resin into the mold to thereby form a resin seal part that configures a portion of the container and seals the IC tag component, such that the resin seal part is joined with the support part.

2. A sealing key comprising:

an IC tag component that has a base, an IC chip mounted on the base, a circuit pattern formed on the base, and including an antenna structure that is connected to the IC chip to enable the IC chip to perform non-contact communication;

a container that has a support part that supports the IC tag component and a resin seal part that is joined with the support part so as to cover and seal the IC tag component, the container having a shape that includes a body part and an insertion part that protrudes from the body part, and wherein the IC tag component is fixed inside the container such that the circuit pattern is positioned being extended across a boundary between the insertion part and the body part.

3. The sealing key of claim 2, wherein the base is paper; and wherein in the circuit pattern, at least a portion that extends across the boundary between the insertion part and the body part is a printed material.

4. The sealing key of claim 2, wherein the base includes a more easy-to-split part that extends across the boundary between the insertion part and the body part and decreases a strength against splitting of the base along the boundary.

5. The sealing key of claim 4, wherein at least one of a slit, a perforation, and a notch is formed in the more easy-to-split part.

6. The sealing key of claim 2, wherein the base includes a more easy-to-split part that extends across the boundary between the insertion part and the body part; and wherein an area occupied by the base in an extending direction of the boundary is minimized in the more easy-to-split part.

7. The sealing key of claim 2, further comprising an adhesive layer that bonds the IC tag component and the support part.

8. The sealing key of claim 7, wherein between the IC tag component and the support part, the adhesive layer is positioned in a portion other than a portion that extends across the boundary between the insertion part and the body part.

9. The sealing key of claim 2, wherein the base has a hole formed in a portion that faces the support part; and the support part further comprises a protrusion that penetrates the hole.

10. The sealing key of claim 2, wherein a communication wavelength in the IC tag component is taken as $\lambda$; and wherein a minimum length of the circuit pattern taken from an intersection of the circuit pattern and the boundary to a connecting point of the circuit pattern and the IC chip is equal to or less than $\lambda/20$.

11. A sealing device comprising:

the sealing key of claim 2; and a sealing device body that comprises a sealing key fixing mechanism that allows the sealing key to be fixed in the body when the insertion part is inserted into the body.

* * * * *